United States Patent [19]

Furukawa et al.

[11] Patent Number: 5,135,885

[45] Date of Patent: Aug. 4, 1992

[54] METHOD OF MANUFACTURING SILICON CARBIDE FETS

[75] Inventors: Katsuki Furukawa, Sakai; Yoshihisa Fujii, Nara; Mitsuhiro Shigeta, Kyoto; Akira Suzuki, Nara, all of Japan

[73] Assignee: Sharp Corporation, Osaka, Japan

[21] Appl. No.: 499,889

[22] Filed: Mar. 27, 1990

[30] Foreign Application Priority Data

Mar. 27, 1989 [JP] Japan .................................. 1-75665
Apr. 28, 1989 [JP] Japan .................................. 1-111400

[51] Int. Cl.⁵ .......................................... H01L 21/20
[52] U.S. Cl. ........................................ 437/100; 437/21; 437/40
[58] Field of Search ................ 437/940, 40, 29, 22, 437/100, 21; 148/DIG. 76, DIG. 148

[56] References Cited

U.S. PATENT DOCUMENTS

| | | | |
|---|---|---|---|
| 3,629,011 | 12/1971 | Tohi | 148/DIG. 148 |
| 4,757,028 | 7/1988 | Kondoh | 148/DIG. 148 |
| 4,762,806 | 8/1988 | Suzuki | 437/100 |
| 4,855,254 | 8/1989 | Eshita | 148/DIG. 148 |
| 4,912,063 | 3/1990 | Davis | 148/DIG. 148 |
| 4,945,394 | 7/1990 | Palmour | 437/100 |
| 4,947,218 | 8/1990 | Edmond | 437/192 |

FOREIGN PATENT DOCUMENTS

| | | | |
|---|---|---|---|
| 0363944 | 10/1989 | European Pat. Off. . | |
| 203799 | of 1984 | Japan . | |
| 216362 | 9/1987 | Japan . | |
| 299075 | 12/1987 | Japan . | |
| 1194315 | 8/1989 | Japan | 437/100 |
| 49422 | 2/1990 | Japan . | |
| 2102557 | 4/1990 | Japan . | |

OTHER PUBLICATIONS

Bumgarner et al., "Monocrystalline β-SiC Semiconductor thin films: epitaxial Growth, doping, and FET Device Development"; 1988 Proc. of the 39th Electronics Compnt. Conf.; IEEE; pp. 342-349; 1988.

Marsh, O. J. & H. L. Dunlap, *Radiation Effects* (1970), pp. 301-312, Gordon & Breach Publishers, Ltd.

Shibahara, K. et al., "Fabrication of Inversion-Type n-channel Mosfets Using Cubic SiC on SI(100)", IEEE Electron Device Letters, vol. EDL-7, #12, Dec. 1986, pp. 692-693.

The Transaction of Appl. Phys. Lett 49 (8), Aug. 25, 1986.

The Transaction of Appl. Phys. Lett 61(2), Jan. 15, 1987.

*Primary Examiner*—Brian E. Hearn
*Assistant Examiner*—Trung Dang
*Attorney, Agent, or Firm*—David G. Conlin; Robert F. O'Connell

[57] ABSTRACT

A method of manufacturing a semiconductor device comprises the steps of (i) forming a SiC monocrystal layer over the entire surface of a semiconductor substrate; (ii) forming a boron ion implanted layer, which is substantially a thin film, by implanting a specified amount of boron ions in the surface region of the SiC monocrystal layer; and (iii) forming a high resistance SiC monocrystal layer of a thin film by subjecting the boron ion implanted layer to heat treatment; whereby the high resistance SiC monocrystal layer can be function at least as an electric insulating layer.

12 Claims, 4 Drawing Sheets

METHOD OF MANUFACTURING SILICON CARBIDE FETS

BACKGROUND OF THE INVENTION

1. Field of the Invention

The present invention relates to a method of manufacturing a semiconductor device, and more specifically, to a method of manufacturing a silicon carbide (SiC) semiconductor device having a high resistance silicon carbide monocrystal layer which functions as an electric insulating layer or functions as an electric insulating layer and a channel layer. Particularly, it relates to a method of manufacturing an insulated gate field effect transistor and a Schottky field effect transistor for high temperature operation, whose device characteristics are not deteriorated until the temperature reached a high temperature range about 500° C.

2. Description of the Prior Art

Semiconductor devices (e.g., a diode, a transistor, an integrated circuit, a large scale integrated circuit, a light emitting diode, a semiconductor laser and a charge coupled device) using compound semiconductors such as silicon (Si) and others like gallium arsenide (GaAs), gallium phosphide (GaP), etc., have been developed generally in every field of electronics.

Silicon carbide (SiC) is a semiconductor material having a large forbidden band width (2.2 to 3.3 eV) and has an outstanding characteristic that it is thermally, chemically and mechanically extremely stable and withstands radiation damage. It is difficult to use semiconductor device employing a conventional semiconductor material such as silicon, under the severe condition like high temperature, high output drive, radiation irradiation, etc. Accordingly, a semiconductor device employing silicon carbide is expected to be applied in variety of fields as a semiconductor device which can be used under such severe conditions.

However, crystal deposition technique by which silicon carbide monocrystal of a large area and of high quality is produced stably on the basis of industrial scale allowing for productivity has not been established. Therefore, silicon carbide has not been practically used although it is a semiconductor material having various advantages and possibility as mentioned above.

Conventionally, on the basis of investigation in laboratories, a silicon carbide monocrystal of a size at which an experimental prototype of a semiconductor device can be manufactured is obtained by depositing silicon carbide monocrystal by sublimate recrystalization method (Rayleigh method) and depositing silicon carbide monocrystal layer on a substrate of the silicon carbide monocrystal thus obtained, by chemical vapor deposition method (CVD method) and liquid phase epitaxial growing method (LPE method). However, with these methods, obtained monocrystal is small in area and it is difficult to control its size and shape with high accuracy. Moreover, it is not easy to control crystal polymorphism and impurity concentration of silicon carbide. Thus, a technique of manufacturing a semiconductor device employing the silicon carbide monocrystal is anything but a practical manufacturing method on the basis of industrial scale.

To solve these problems, the inventors of the present invention proposed a method of depositing silicon carbide monocrystal of a large area and of good quality on a silicon monocrystal substrate which is cheap and commercially available (Unexamined Japanese Patent Publication No. 203799, 1084). This method employs a technique of forming a silicon carbide thin film on a silicon monocrystal substrate by low temperature CVD method and depositing silicon carbide monocrystal by CVD at higher temperature. With this method, implanting impurity in depositing silicon carbide by means of CVD makes it possible to control impurity concentration and conductivity type of the obtained silicon carbide monocrystal.

Utilizing the silicon carbide monocrystal layer formed on the silicon monocrystal substrate by this method, methods of manufacturing various semiconductor devices (e.g., a diode and a transistor) has been developed. When a plurality of semiconductor devices of various types should be made in the silicon carbide monocrystal on the silicon substrate, there are many cases where electrical isolation among devices is required, and it is desirable that the devices are made on the silicon monocrystal substrate having high electric resistance. However, with the above-mentioned chemical vapor deposition method, the silicon carbide monocrystal layer having high electric resistance can not be obtained.

Accordingly, the inventors proposed a method of forming a silicon carbide film of high electric resistance by implanting boron to a silicon carbide monocrystal in a process of forming this silicon carbide monocrystal on a silicon substrate by chemical vapor deposition (Unexamined Japanese Patent Publication No. 264399, 1985). In this method, the temperature of the silicon carbide monocrystal substrate is kept at about 1,350° C., and mono-silane ($SiH_4$) and propane ($C_3H_8$) as ingredient gases are supplied about 0.4 cc per minute. At the same time, diborane ($B_2H_6$) as a gas for impurity is supplied 0.02 cc per minute with hydrogen carrier gas (3 liters per minute) from a branch pipe. Thus, deposition is carried out for one hour. As a result, a high resistance silicon carbide monocrystal film having a resistivity of 600 $\Omega \cdot cm$ is obtained on the entire surface of the silicon monocrystal substrate with a thickness of about 2 $\mu m$.

In other words, the silicon carbide monocrystal film is deposited on the silicon monocrystal substrate by supplying the ingredient gas consisting of mono-silane and propane, and boron is added to the silicon carbide monocrystal film as impurity by simultaneously supplying diborane.

In general, in these silicon carbide semiconductor devices (e.g., a field effect transistor), an n-type (or p-type) silicon carbide monocrystal layer to be a channel layer is formed on a p-type (or n-type) silicon carbide monocrystal layer by chemical vapor deposition method, using boron, Al or the like as impurity so that the pn junction of these layer electrically insulate the channel layer from the semiconductor substrate. However, in the semiconductor device having thus structured, when reverse bias voltage is applied to the pn junction, leak current is generated between the semiconductor substrate and the channel layer due to crystal defects existing in the silicon carbide monocrystal layer. Accordingly, it is difficult to completely electrically insulate the channel layer from the semiconductor substrate, and thus good transistor characteristic can not be obtained. Even if the thickness of the silicon carbide monocrystal layer deposited by chemical vapor deposition is made larger to avoid an influence of the crystal defects, the crystal defects still exercise an influence, and the leak current is generated.

Conventionally, a high resistance silicon carbide monocrystal layer has been used as an electric insulating layer between a semiconductor substrate and a channel layer instead of the above-mentioned pn junction between silicon carbide monocrystal layers, so as to electrically insulate the semiconductor substrate and the channel layer.

However, when especially an insulated gate field effect transistor (MOSFET) is formed using silicon carbide monocrystal, a channel layer is formed on an electric insulating layer, and thereafter drain and source regions must be provided in the channel layer. On the channel layer, a gate insulating film must be further formed. Thus, in order to simplify the manufacturing process, it is considered that a single high resistance silicon carbide monocrystal layer serves as both the electric insulating layer and the channel layer, but in this case, the problem is a method of manufacturing a silicon carbide monocrystal layer having a sufficient resistance to function as both the electric insulating layer and the channel layer.

In the case where a high resistance silicon carbide monocrystal layer is used as an electric insulating layer having a channel layer of a SiC monocrystal layer on an upper part in a Schottky field effect transistor (MESFET), the problem is a method of forming the silicon carbide monocrystal layer.

Conventionally, as such forming methods, for example, boron may be added as impurity in depositing a SiC monocrystal layer by the above-mentioned chemical vapor deposition, or boron, or impurity, may be thermally diffused into a SiC monocrystal layer deposited in advance.

However, boron added into the SiC monocrystal layer in the chemical vapor deposition is not completely ionized at the room temperature, but the carrier concentration in the silicon carbide monocrystal layer increases as the temperature rises. That is, as shown in FIG. 5, the resistivity of the silicon carbide monocrystal layer lowers as the temperature rises. (See A. Suzuki et al., Appl. Phys. Lett., 49, 450 (1986) and M. Yamanaka et al., J. Appl. Phys., 61, 599 (1987), for example.) Therefore, these methods are inappropriate to manufacture a high resistance SiC monocrystal layer satisfactory to a SiC semiconductor device for high temperature operation at a high temperature range of 200° C. to 500° C., even if it were made as a high resistance SiC monocrystal layer which functions as an electric insulating layer or functions as an electric insulating layer and a channel layer (the electric insulating layer serves as the channel layer). Additionally, since the SiC monocrystal is deposited by chemical vapor deposition with impurity being added, many concave and convex portions are caused on the surface of the deposited layer of the SiC monocrystal. Especially, in a MOSFET, the surface of a channel layer of silicon carbide monocrystal decreases in flatness, and adverse effect is exerted on a characteristic of a gate insulating film formed on the channel layer.

On the other hand, when a high resistance layer is formed by thermally diffusing boron as impurity into a silicon carbide monocrystal layer deposited in advance, a constant of impurity diffusion in silicon carbide is small, and high diffusing temperature of 1600° C. or more is required. Accordngly, the the method thermally diffusing impurity is inappropriate as a process technique of a silicon carbide semiconductor device, because it is difficult to control impurity concentration, and the used semiconductor substrate and silicon carbide monocrystal layer may be deteriorated. Moreover, with both the methods, crystal defects undeniably exert an influence.

The present invention solves the above problems in the conventional embodiment, and it is an object of the present invention to provide a silicon carbide semiconductor device having a high resistance silicon carbide monocrystal layer which is easily controlled in its impurity concentration and functions as an electric insulating layer or as an electric insulating layer and a channel layer even in a high temperature range around 500° C., for example.

Thus, the present invention provides a method of manufacturing a semiconductor device, comprising the steps of (i) forming a SiC monocrystal layer over the entire surface of a semiconductor substrate; (ii) forming a boron ion implanted layer, which is substantially a thin film, by implanting a specified amount of boron ions in the surface region of the SiC monocrystal layer; and (iii) forming a high resistance SiC monocrystal layer of a thin film by subjecting the boron ion implanted layer to heat treatment; whereby the high resistance SiC monocrystal layer can be function at least as an electric insulating layer.

PREFERRED EMBODIMENT

Figure 1A:
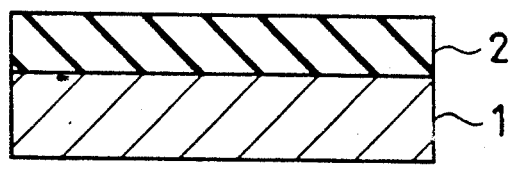
FIGS. 1(a) to (e) are diagrams for explaining manufacturing steps of a Schottky field effect transistor which is a first embodiment of a SiC semiconductor device obtained by a manufacturing method of the present invention.

The most significant characteristic of the present invention is to manufacture a high resistance SiC monocrystal layer by the steps of implanting boron ions into a surface region of a SiC monocrystal layer and subjecting it to heat treatment to form a thin film.

As has been described, it is a well-known fact that the high resistance SiC monocrystal obtained by combining SiC monocrystal with boron has been implemented by a chemical vapor deposition method. Further, in this invention, an ion implanting technique and a heat treatment technique employ known means.

However, as a result of enthusiastic researches, the inventors of the present invention have come to intend to effectively use the characteristic of the ion implantation technique. That is, utilizing the ion implantation technique by which the depthwise concentration and distribution of the boron ions themselves can be accurately controlled simply by limiting accelerating voltage, current and implanting time of the boron ions, the inventors have found that (1) a thin film high resistance SiC monocrystal layer can be obtained without causing crystal defects, (2) the boron ions themselves are uniformly disposed in the thin film independent of its depthwise direction however thin it may be, and thereby a sufficient resistivity is maintained in a high temperature range around 500° C. so that the thin film functions as an electric insulating layer or functions as an electric insulating layer and a channel layer, the resistivity not lowering as usual as temperature rises to the high temperature range, and (3) although, in a MOSFET of a conventional embodiment whose manufacturing process includes a step of performing chemical vapor deposition simultaneously with implanting impurity, as mentioned above, many concave and convex portions are caused on the surface of growing layer of the SiC monocrystal and a channel layer consisting of high resistance SiC monocrystal thus obtained decreases in its surface flatness, introducing an ion implantation method prevents the surface of the channel layer from losing its flatness, and adverse effect on the characteristic of a gate insulating film formed on the channel layer can be avoided. Thus, the present invention overcomes problems in the prior art embodiment.

Thus, according to the present invention, the high resistance SiC monocrystal layer functions as an electric insulating layer, and the high resistance SiC monocrystal layer functions as an electric insulating layer and a channel layer are formed by the ion implantation method, whereby a stable semiconductor device whose device characteristic is not deteriorated until the temperature reaches the high temperature range around 500° C. Such a SiC semiconductor device is useful as a semiconductor device which especially withstands a high temperature operation. Further, since the present invention employs an ordinary ion implantation technique, various SiC semiconductor devices, for example, transistors such as a gate insulating field effect transistor (MOSFET) and a Schottky field effect transistor (MESFET) and integrated circuits employing these transistors can be produced in the industrial scale.

In the present invention, that a boron ion implanted layer is substantially a thin film means that the boron ion implanted layer is formed with a specified thickness of 0.5 to 1.0 μm in the surface region of the SiC monocrystal layer.

The boron ion implanted layer can be formed by implanting boron ions either only once or several times. The boron ions are implanted several times to enhance uniformity of the boron ion concentration. If the boron ion concentration in the boron ion implanted layer is sufficiently uniformed and kept at a desired concentration by implanting the boron ions only once, there is no problem.

The requirements of boron ion implantation are
(i) accelerating voltage of 400 keV at the highest is used;
(ii) controlling the amount of doped boron ions is restricted in the order of $10^{14}$ to $10^{15}$; and
(iii) the boron ion implanted layer is formed into a thin film having the thickness of approximately 1 μm by selecting an implanting step where the boron ions are implanted only once; or
(iv) the boron ion implanted layer is formed into a thin film having the thickness of approximately 1 μm by selectign an implanting step where the boron ions are implanted several times.

Figure 1B:
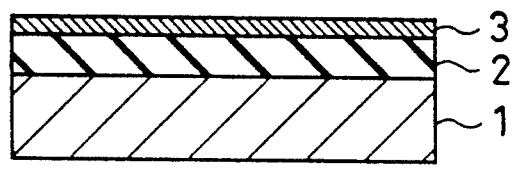

For example, FIG. 1(b) shows a boron ion implanted layer (3) formed with a film thickness of approximately 0.5 μm. The boron ion implanted layer (3) is formed by implanting ions two separate times to enhance uniformity of the boron ions. In the first implantation, the boron ions are implanted to a lower region intended to be the boron ion implanted layer by the dose amount of $1 \times 10^{15}$ cm$^{-2}$ with 200 keV accelerating voltage and in the second implantation, the boron ions are implanted to an upper region by the dose amount of $5 \times 10^{14}$ cm$^{-2}$ with 100 keV accelerating voltage. Thus, the ion implanted layer (3) of a thin film which is uniformed in boron ion concentration is formed.

Figure 2A:
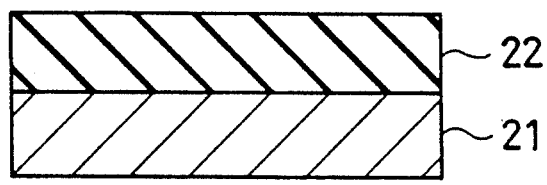
FIGS. 2(a) to (e) are diagrams for explaining manufacturing steps of an insulated gate field effect transistor which is a second embodiment of the SiC semiconductor device obtained by the manufacturing method of the present invention.
Figure 2B:
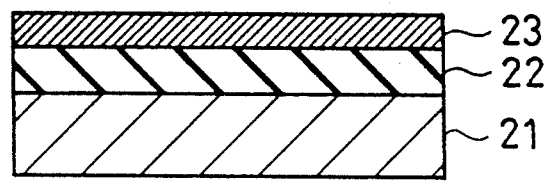

FIG. 2(b) shows a boron ion implanted layer (23) formed with a film thickness of approximately 0.5 μm. In this case, the boron ions are implanted two separate times. In the first implantation, the boron ions are implanted to a lower region by a dose amount of $1 \times 10^{15}$ cm$^{-2}$ with 200 keV accelerating voltage, and in the second implantation, the boron ions are implanted to an upper region by a dose amount of $5 \times 10^{14}$ cm$^{-2}$ with 100 keV accelerating voltage.

The boron ion implanted layers (3), (23) thus obtained are then subjected to heat annealing treatment. This heat annealing treatment is carried out in the atmosphere including inactive gas (e.g., Ar gas) and $N_2$ gas at about 1000° to 1400° C. Because of this annealing treatment, the boron ion implanted layer is activated, and thus the high resistance SiC monocrystal layer which can be operable under the high temperature of 200° to 500° C. and having a resistivity of 600 Ω·cm or more.

As the high resistance SiC monocrystal layer according to the present invention, preferably it is a thin film having a thickness of 0.5 to 1.0 μm. Conventionally, a high resistance SiC monocrystal layer of high electric resistance, which is obtained by adding boron to a SiC monocrystal layer, must be formed as a thick film having a thickness of approximately 5 μm to decrease crystal defects caused in the interface of the pn junction. Accordingly, in the present invention, the high resistance SiC monocrystal layer can be obtained as a far thinner film. Additionally, as stated above, the ion implanting method is used to implant the boron ions, whereby, as also stated above, various problems in the conventional embodiment can be solved.

Figure 1C:
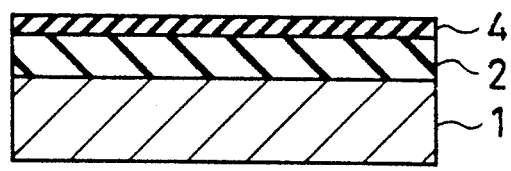
Figure 2C:
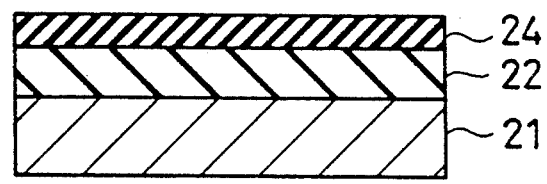

For example, FIGS. 1(c) and 2(c) show high resistance SiC monocrystal layers (4), (24) formed with 0.5 μm in thickness and 600 Ω·cm in resistivity by activating the boron implanted layers (3), (23) under the heat treatment condition those implanted layers are annealed in the atmosphere of Ar gas at a temperature of approximately 1300° C. for 30 minutes.

Figure 1D:
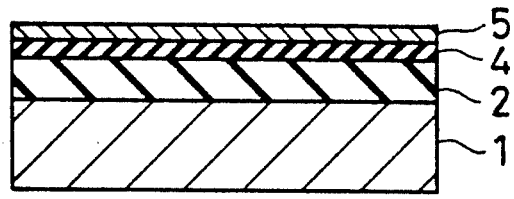
Figure 1E:
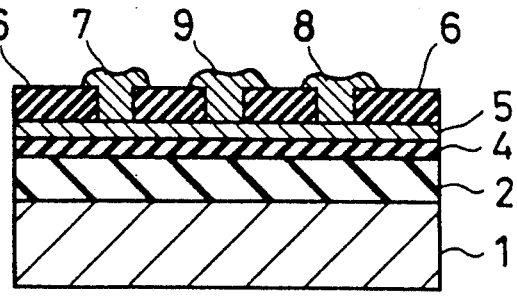

FIG. 1(e) shows a MESFET in which a high resistance SiC monocrystal layer (4) is so formed that it can function even in a high temperature range of 200° C. to 500° C. as an electric insulating layer which electrically insulates a SiC monocrystal layer (5), which is placed over the entire surface of the SiC monocrystal layer (4) and serves as a channel layer, from a semiconductor substrate (1) of SiC or Si.

Figure 2D:
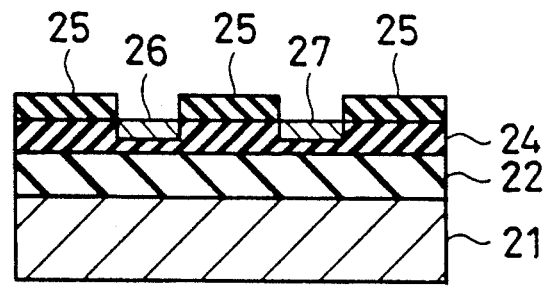
Figure 2E:
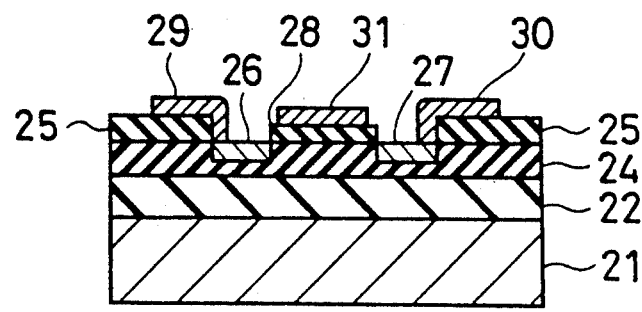

FIG. 2(e) shows a MOSFET in which the high resistance SiC monocrystal layer (24) is so formed that it can function as an electric insulating layer serving also as a channel layer even at a high, temperature range of 200° C. to 500° C.

Now, embodiments of the present invention will be described.

FIG. 1(e) shows a Schottky gate field effect transistor (MESFET) which is a first embodiment of a SiC semiconductor device obtained by a manufacturing method of the present invention. The MESFET is manufactured as follows.

Figure 3:
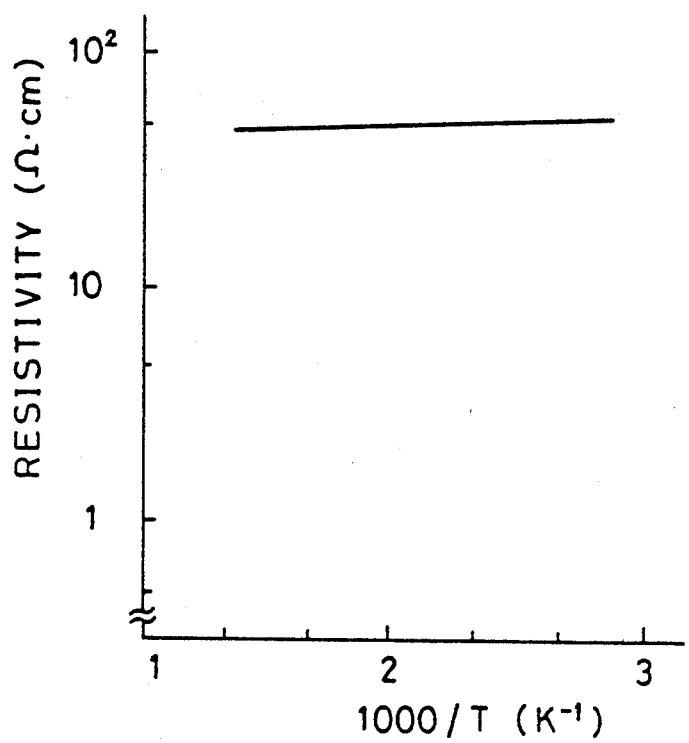
FIG. 3 is a temperature-to-resistivity characteristic diagram showing variation in the resistivity of the field effect transistor of the first embodiment related to temperature variation.
Figure 5:
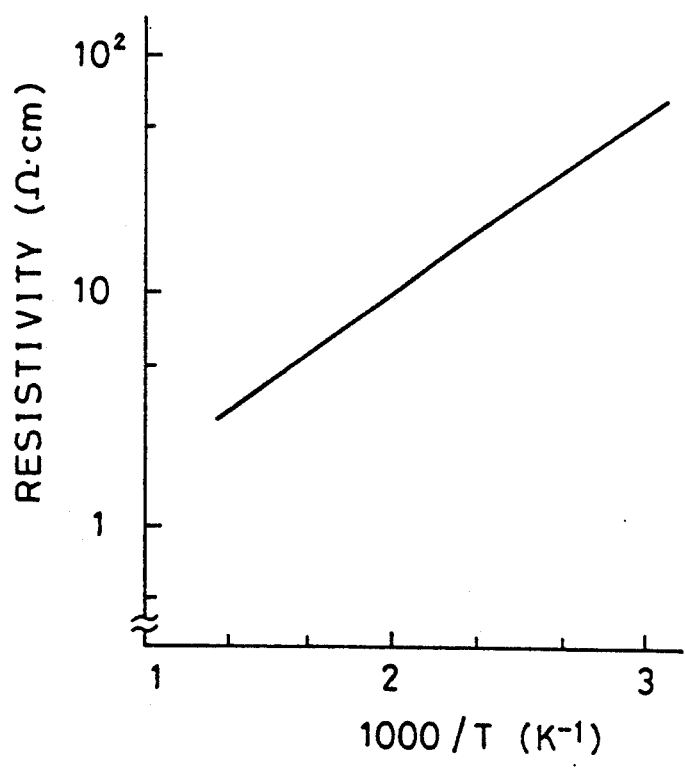
FIG. 5 is a temperature-to-resistivity characteristic diagram showing variation in the resistivity of an electric insulating layer formed by a conventional manufacturing method related to temperature variation.

First, as shown in FIG. 1(a), a non-dope SiC monocrystal layer 2 (layer thickness of about 10 μm) is deposited at 1,350° C. on the Si monocrystal substrate 1 by chemical vapor deposition (CVD) method. Then, boron ions ($^{11}B^+$) are implanted in the surface region of the non-dope SiC monocrystal layer 2 separate times with an ion implanting device to form a boron ion implanted layer 3 (layer thickness of about 0.5 μm) as shown in FIG. 1(b). The implanting condition is that the accelerating voltages are 200 keV and 100 keV, respectively, and the amounts of implanted boron ions are $1 \times 10^{15}$ cm$^{-2}$ and $5 \times 10^{14}$ cm$^{-2}$, respectively. Heat annealing treatment is performed in the Ar atmosphere at 1,300° C. for 30 minutes to activate the boron ion implanted layer 3, and a high resistance SiC monocrystal layer (i.e., an electric insulating layer) 4 as shown in FIG. 1(c) is formed. The resistivity of the high resistance SiC monocrystal layer 4 is measured to find that it is about $6 \times 10^2$ Ω·cm at the room temperature, and the reduction of the resistivity is hardly observed in a wide range from the room temperature to about 500° C. to also find that the high resistance SiC monocrystal layer 4 has sufficient capability as an electric insulating layer. FIG. 3 shows variation in the resistivity of the high resistance SiC monocrystal layer (electric insulating layer) 4 related to temperature variation.

Then, a non-dope SiC monocrystal layer (layer thickness of about 0.5 μm) is deposited on the electric insulating layer 4 by the CVD method and serves as a channel layer 5 (FIG. 1(d)). Further, a SiO$_2$ film (film thickness of about 1 μm) is formed on the channel layer 5 by the CVD method or a plasma CVD method. Then, a specified region of the SiO$_2$ film is etched away to make an opening by means of photolithography, so as to define a field insulating film 6 (FIG. 1(e)). A hydrogen fluoride (HF) solution is used for etching. Last, nickel (Ni) for ohmic electrodes is deposited in openings corresponding to source and drain regions and gold (Au) for a Schottky electrode is deposited in an opening corresponding to a gate region by vacuum evaporation, respectively, and thereafter a source electrode 7, a drain electrode 8 and a gate electrode 9 are formed by photolithography to obtain a MESFET shown in FIG. 1(e).

As a result of investigating a transistor characteristic of the MESFET thus obtained, since a high resistance SiC monocrystal layer to which the boron ions have been implanted is used as an electric insulating layer 4 formed in a lower part of the channel layer 5, leak current flowing in the direction from the channel layer 5 to the SiC monocrystal substrate 1 is reduced, and good transistor characteristic is obtained. Further, as a result of investigating a rectification characteristic of the electric insulating layer 4 and the channel layer 5, there is no problem from the room temperature to about 500° C., and particularly, degradation of the rectification characteristic caused by increase in the leak current at high temperature was not observed.

FIG. 2(e) shows an insulated gate field effect transistor (MOSFET) which is a second embodiment of the SiC semiconductor device of the present invention. The MOSFET is manufactured as follows.

First, as shown in FIG. 2(a), a non-dope SiC monocrystal layer 22 is deposited on a Si monocrystal substrate 21 by chemical vapor deposition (CVD) method. Then, boron ions ($^{11}B^+$) are implanted to the surface region of the non-dope SiC monocrystal layer 22 two separate times with an ion implanting device to form a ion implanted layer 23 as shown in FIG. 2(b). The implanting condition is that the accelerating voltages are 200 keV and 100 keV, respectively, and the amounts of implanted boron ions are $1 \times 10^{15}$ cm$^{-2}$ and $5 \times 10^{14}$ cm$^{-2}$, respectively.

Subjected to heat annealing treatment at about 1,000° to 1,300° C., a boron ion implanted layer 23 is activated to form the high resistance SiC monocrystal layer (e.g., the electric insulating layer and the channel layer) 24 as shown in FIG. 2(c). As a result of measuring the resistivity of the high resistance SiC monocrystal layer 24, reduction of the resistivity is hardly observed in a wide temperature range, and it is found that the high resistance SiC monocrystal layer 24 has sufficient capability as the electric insulating layer and the channel layer.

Then, a SiO$_2$ film is formed on the high resistance SiC monocrystal layer 24 by the CVD method or the plasma CVD method. Then, a specified region of the SiO$_2$ film is etched away by photolithography to make an opening, so as to define a field insulating film 25 (FIG. 2(d)). A hydrogen fluoride (HF) solution is used for etching. Phosphorus ions ($^{31}P^+$) are implanted to the opening of the high resistance SiC monocrystal layer 24 with an ion implanting device, using the field insulating film 25 as a mask. The implanting condition is that the accelerating voltage is 100 keV and the amount of implanted phosphorus ions is $3 \times 10^{14}$ cm$^{-2}$. Then, subjected to heat annealing treatment at about 1,000° to 1,200° C., the p ion implanted region is activated to form source and drain regions 6 and 7 as shown in FIG. 2(d).

After the field insulating film 25 corresponding to the gate region is etched away, heat oxidation is carried out in the oxygen atmosphere at 1,100° C. for 4 hours to for a gate insulating film 28. Last, aluminum (Al) is deposited by vacuum evaporation on openings corresponding to the source and drain regions 26 and 27 and the gate insulating film 28 corresponding to the gate region, thereafter a source electrode 29, a drain electrode 30 and a gate electrode 31 are formed by photolithography, and thus a MOSFET as shown in FIG. 2(e) is obtained.

In the MOSFET thus obtained, the high resistance SiC monocrystal layer 24 serves not only as the electric insulating layer but as the channel layer. Specifically, when voltage is applied to the gate electrode 11, a channel region is generated in the surface of the high resistance SiC monocrystal layer 24, current flows between the source region 26 and the drain region 27 through the channel region, and thus the FET operation is performed. Investigation of a transistor characteristic of the MOSFET brings about a characteristic diagram as shown in FIG. 4.

For comparison, a MOSFET was manufactured in the same way as the above-mentioned embodiment except for using a silicon carbide monocrystal layer which is deposited by chemical vapor deposition while boron impurity is being added instead of the boron ion implanted layer 23. A transistor characteristic of the MOSFET thus obtained is shown in FIG. 6.

Figure 4:
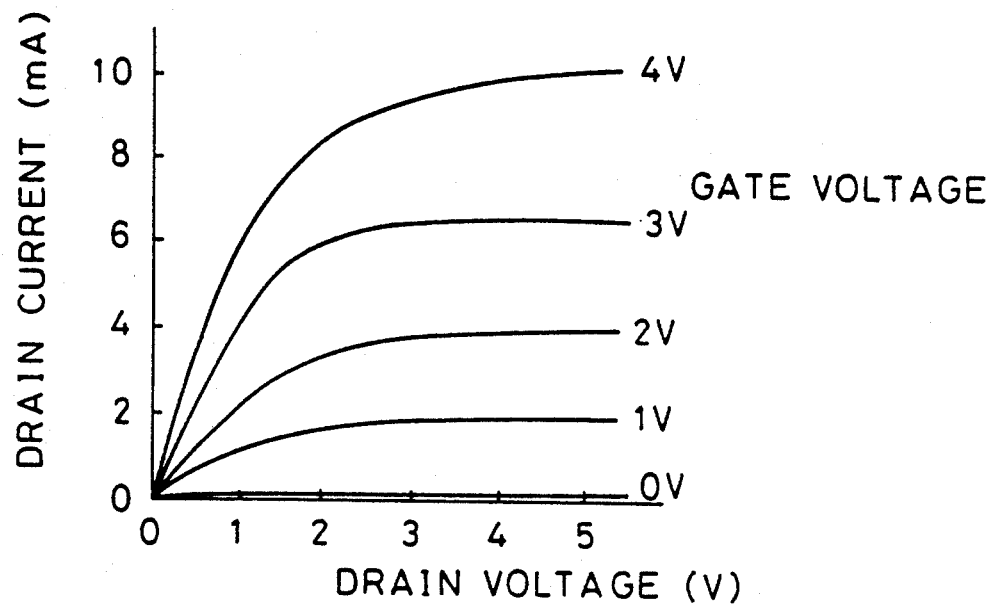
FIG. 4 is a diagram showing a drain characteristic of the field effect transistor of the second embodiment.
Figure 6:
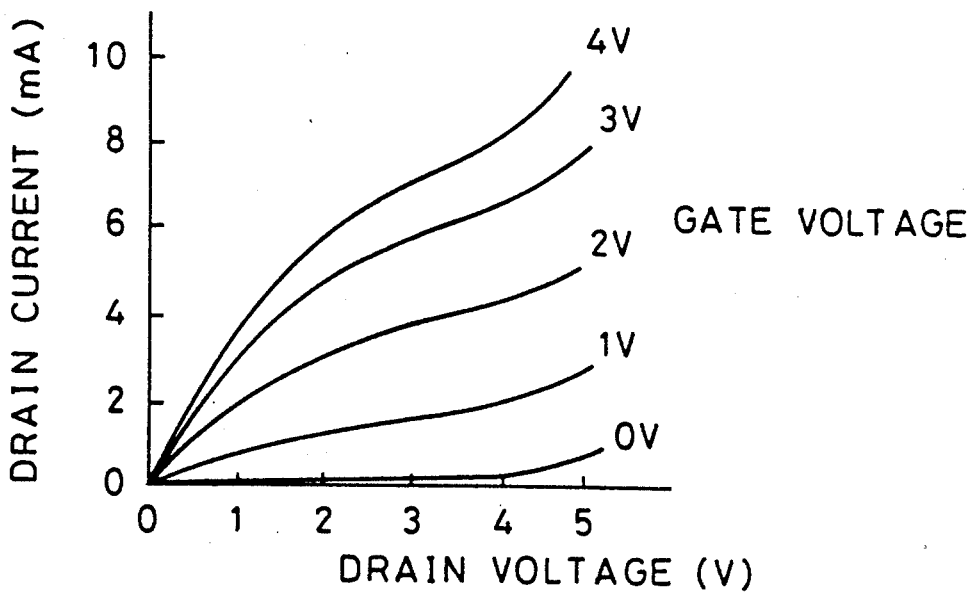
FIG. 6 is a diagram showing a drain characteristic of an insulating gate field effect transistor manufactured in accordance with the conventional method.

As can be seen from FIGS. 4 and 6, in the MOSFET of this embodiment, since the high resistance SiC monocrystal layer 24 to which the boron ions are implanted is used as the electric insulating layer and the channel layer, a characteristic of the gate insulating film 28 is improved and the leak current from the source region 26 and the drain region 27 in the channel layer to the Si monocrystal substrate 21 is reduced. Such a good transistor characteristic is stable until temperature reaches the high temperature range.

What is claimed is:

1. A method of manufacturing a semiconductor device containing Si, comprising the steps of:
   (i) forming a SiC monocrystal layer over the entire surface of a semiconductor substrate containing Si;
   (ii) forming a substantially thin film boron ion implanted layer by implanting a specified amount of boron ions one or more times in the surface region of said SiC monocrystal layer, said boron ions being implanted under conditions wherein the accelerating voltage used therefor is from 100 keV to 400 keV; and
   (iii) forming a thin film high resistance SiC monocrystal layer by subjecting said boron ion implanted layer to heat treatment at a temperature from 1000° C. to 1400° C.; whereby said high resistance SiC monocrystal layer can function at least as an electric insulating layer.

2. A method according to claim 1, wherein said boron ion implanted layer is formed on the surface region of said SiC monocrystal layer as a thin film having a thickness of 1 μm or under.

3. A method according to claim 1, wherein said high resistance SiC monocrystal layer is so formed to have a resistivity of 600 Ω·cm or more so as to permit operation of said device at temperatures as high as of 200° C. to 500° C.

4. A method according to claim 1, wherein said high resistance SiC monocrystal layer is formed in the surface region of said SiC monocrystal layer as a thin film having a thickness of 1 μm or under.

5. A method according to claim 1, wherein said boron ion implanted layer is subjected to heat treatment in an atmosphere of inert gas or $N_2$ gas.

6. A method according to claim 1, wherein a Schottky filed effect transistor is formed, having a further SiC monocrystal layer formed over the entire surface of said high resistance SiC monocrystal layer and source, gate and drain electrodes are formed on said further SiC monocrystal layer.

7. A method according to claim 1, wherein an insulated gate field effect transistor is formed having source and drain regions provided on a specified regions of said high resistance SiC monocrystal layer, source and drain electrodes electrically connected to said source and drain regions and a gate electrode provided on said high resistance SiC monocrystal layer between said source and drain regions with a gate insulating film intervening.

8. A method according to claim 2, wherein said boron ion implanted layer is a thin film having a thickness of approximately 0.5 μm, which is formed on the surface region of said SiC monocrystal layer by implanting boron ions two times under conditions such that the accelerating voltages are 200 keV and 100 keV, respectively, and the amount of implanted boron ions is $1 \times 10^{15}$ CM$^{-2}$.

9. A method according to claim 2, wherein said boron ion implanted layer is a thin film having a thickness of approximately 0.5 μm, which is formed on the surface region of said SiC monocrystal layer by implanting boron ions two times under conditions said that the accelerating voltages are 200 keV and 100 keV, respectively, and the amounts of implanted boron ions are $1 \times 10^{15}$ cm$^{-2}$ and $5 \times 10^{14}$ cm$^{-2}$, respectfully.

10. A method according to claims 3, 4, 5, 6, or 8, wherein said high resistance SiC monocrystal layer is so formed as to have a thickness of 0.5 μm and a resistivity of 600 Ω·cm by heating said boron ion implanted layer in an atmosphere of Ar gas at approximately 1,300° C. for 30 minutes.

11. A method according to claim 6, wherein said high resistance SiC monocrystal layer electrically insulates said further SiC monocrystal layer from said semiconductor substrate, and said further SiC monocrystal layer is a channel layer over the entire surface at temperature as high as 200° C. to 500° C.

12. A method according to claim 7, wherein said high resistance SiC monocrystal layer is a channel layer and an electric insulating layer for insulating said channel layer from said semiconductor substrate at temperatures as high as 200° C. to 500° C.

* * * * *